(12) United States Patent
Saint-Jalmes et al.

(10) Patent No.: US 10,663,554 B2
(45) Date of Patent: May 26, 2020

(54) PRODUCTION MODULE AND METHOD, IMAGING DEVICE AND METHOD AND MRI AND/OR MRS PROGRAMS

(71) Applicants: Universite De Rennes 1, Rennes (FR); Institut National de la Sante et de la Recherche Medicale (INSERM), Paris (FR); Fondat Region Ouest Ligue Cancer, Rennes (FR)

(72) Inventors: Hervé Saint-Jalmes, Rennes (FR); Giulio Gambarota, Rennes (FR)

(73) Assignees: Universite De Rennes 1 (FR); Institut National de la Sante et de la Recherche Medicale (INSERM) (FR); Fondat Region Ouest Ligue Cancer (FR)

( * ) Notice: Subject to any disclaimer, the term of this patent is extended or adjusted under 35 U.S.C. 154(b) by 186 days.

(21) Appl. No.: 15/575,243

(22) PCT Filed: Apr. 1, 2016

(86) PCT No.: PCT/EP2016/057286
§ 371 (c)(1),
(2) Date: Nov. 17, 2017

(87) PCT Pub. No.: WO2016/184595
PCT Pub. Date: Nov. 24, 2016

(65) Prior Publication Data
US 2018/0136299 A1    May 17, 2018

(30) Foreign Application Priority Data
May 20, 2015    (FR) .................................... 15 54502

(51) Int. Cl.
*G01R 33/58*    (2006.01)

(52) U.S. Cl.
CPC .................................... *G01R 33/58* (2013.01)

(58) Field of Classification Search
None
See application file for complete search history.

(56) References Cited

U.S. PATENT DOCUMENTS

| 7,064,544 B1 * | 6/2006 | Schirmer | G01N 24/08 |
| | | | 324/307 |
| 7,683,620 B2 * | 3/2010 | Lin | G01R 33/482 |
| | | | 324/309 |

(Continued)

FOREIGN PATENT DOCUMENTS

FR    2735865 A1    12/1996

OTHER PUBLICATIONS

Akoka, et al., "Improvement of the ERETIC Method by Digital Synthesis of the Signal and Addition of a Broadband Antenna Inside the NMR Probe." Instrumentation Science & Technology, vol. 30, No. 1, Nov. 1, 2002, pp. 21-29.

(Continued)

*Primary Examiner* — Jermele M Hollington
(74) *Attorney, Agent, or Firm* — Lerner, David, Littenberg, Krumholz & Mentlik, LLP (57) ABSTRACT

The invention relates to a module (6) for producing an MRI and/or MRS reference signal (S0), characterized in that the module comprises:
  a first receiving input (621) for receiving of an MRI and/or MRS synchronization signal (S3),
  a second receiving input (612) for receiving of a time signal (S8) of external stimulation,
  supply means (62) for supplying of a prescribed signal (RV) representing an MRI and/or MRS virtual object (RVV),
  generating means for generating of the MRI and/or MRS reference signal (S0), for temporally varying the MRI (Continued)

and/or MRS reference signal (S0) in the same way as a time characteristic determined from the time signal (S8) of external stimulation and in synchronization with the MRI and/or MRS synchronization signal (S3), a supply output (632) for supplying of the MRI and/or MRS reference signal (S0).

20 Claims, 8 Drawing Sheets

(56) References Cited

U.S. PATENT DOCUMENTS

| | | | |
|---|---|---|---|
| 8,791,698 B2* | 7/2014 | Umeda | G01R 33/485 324/307 |
| 2011/0316537 A1* | 12/2011 | Umeda | G01R 33/485 324/310 |
| 2013/0053658 A1* | 2/2013 | Peacock | A61B 5/055 600/309 |
| 2016/0157745 A1* | 6/2016 | Peacock, III | A61B 5/055 600/410 |

OTHER PUBLICATIONS

French Preliminary Search Report for Application No. FR1554502 dated Mar. 22, 2016.
Hanson, et al., "Encoding of Electrophysiology and Other Signals in MR Images." Journal of Magnetic Resonance Imaging, vol. 25, No. 5, Apr. 24, 2007, pp. 1059-1066.
Heinzer-Schweizer, et al., "In-vivo assessment of tissue metabolite levels using 1H MRS and the Electric REference to access In vivo Concentrations (ERETIC) method." NMR in Biomedicine, vol. 23, No. 4, Jan. 25, 2010, pp. 406-413.
International Search Report for Application No. PCT/EP2016/057286 dated Jun. 22, 2016.
Nicholas, et al., "The Virtual NMR Spectrometer: A Computer Program for Efficient Simulation of NMR Experiments Involving Pulsed Field Gradients." Journal of Magnetic Resonance, vol. 145, No. 2, Aug. 1, 2000., pp. 262-275.
Saint-Jalmes, et al., "ViP MRI: virtual phantom magnetic resonance imaging." Magnetic Resonance Materials in Physics, Dec. 15, 2013, vol. 27, No. 5, pp. 419-424.
Salvati, et al., "Virtual Phantom (ViP) MRI: a method to generate virtual phantoms that mimic water-fat systems." Proceedings of the Intenrational Society for Magnetic Resonance in Medicine, vol. 23, May 15, 2015, p. 3086.
Sharp, et al., "The integration of real and virtual magnetic resonance imaging experiments in a single instrument." Review of Scientific Instruments, vol. 80, No. 9, Sep. 23, 2009, pp. 093709-1-093709-9.

* cited by examiner

PRODUCTION MODULE AND METHOD, IMAGING DEVICE AND METHOD AND MRI AND/OR MRS PROGRAMS

CROSS REFERENCE TO RELATED APPLICATIONS

The present application is a national phase entry under 35 U.S.C. § 371 of International Application No. PCT/EP2016/057286 filed Apr. 1, 2016, which claims priority from European Patent Application No. 1554502 filed May 20, 2015, the disclosures of which are incorporated herein by reference.

The invention relates to the field of MRI and/or MRS, MRI and/or MRS apparatus and methods, especially MRI and/or MRS scanners.

MRI is the abbreviation for "Magnetic Resonance Imaging".

MRS is the abbreviation for "Magnetic Resonance Spectroscopy". MRI and/or MRS devices are used especially for creating or reconstructing images and/or spectra of a region of an object or a body to be studied, which can be for example an organ of a living being, which can be a human being, such as for example his brain.

Document FR 2 735 865 discloses an analysis device by nuclear magnetic resonance NMR, which comprises electronic means capable of generating a controlled radiofrequency signal having the features of a NMR signal and receptor and processing means adapted to detect this radiofrequency signal during acquisition of the NMR signal of the sample and to use the radiofrequency signal now detected. The document indicates that the radiofrequency signal can apply to the field of the imaging by nuclear magnetic resonance, especially by generation of a continuous frequency band for creating in the image a reference zone of intensity calibrated for measuring noise present in the image to allow quantitative exploitation of the images.

The document "ViP MRI: Virtual Phantom Magnetic Resonance Imaging" of the journal Magn Reson Mater Phy of Dec. 15, 2013 describes an example of MRI imaging devices tested on tubes filled with agar and gadolinium, for viewing in the image a virtual reference of a controlled and constant form and intensity.

The document "Encoding of Electrophysiology and Other Signals in MR Images" relates to an MRI imaging device, in which electrophysiological signals of eye or heart are amplified and sampled to be encoded on radiofrequency (RF) carriers transmitted by an antenna. The signals are then detected by the MRI scanner. The signals can be reconstructed from a spectrogram of the data recorded by the MRI scanner, and provide a calibration signal, of constant intensity.

Devices of the prior art presented in this way therefore have a considerable limitation: it is not possible to view a dynamic virtual reference in the MRI image or on the MRS spectrum.

The aim of the present invention is to propose a device for inserting a virtual reference object, whereof one of the features (the shape and/or MRI intensity, position, width and/or position of the MRS peak(s)) may vary as a function of time, these variations being controlled to be synchronized with an external signal (decorrelated from the MRI scanner).

In addition to supplying calibration means of the MRI and/or MRS systems, the present invention could well have MRI and/or MRS reading of acquisitions synchronized with an external event to be able to draw adequate conclusions, where this problem is not being resolved by the prior art.

The invention aims to provide a module for producing an MRI and/or MRS reference signal improved relative to the prior art to resolve this problem.

For this purpose, a first subject matter of the invention is a module for producing an MRI and/or MRS reference signal, characterized in that the module comprises:
  a first receiving input for receiving of an MRI and/or MRS synchronization signal,
  a second receiving input for receiving of a time signal of external stimulation,
  supply means for supplying of a prescribed signal representing an MRI and/or MRS virtual object,
  generating means for generating of the MRI and/or MRS reference signal by use of the MRI and/or MRS synchronization signal with the time signal of external stimulation and with the MRI and/or MRS virtual object prescribed signal, for temporally varying the MRI and/or MRS reference signal in the same way as a time characteristic determined from the time signal of external stimulation and in synchronization with the MRI and/or MRS synchronization signal,
  a supply output for supplying of the MRI and/or MRS reference signal.

According to an embodiment, the supply means for supplying of a prescribed signal representing an MRI and/or MRS virtual object comprises a memory in which is recorded as prescribed signal representing an MRI and/or MRS virtual object a Fourier transform, in the k-space, of the virtual object or a representation in the reciprocal k-space of the virtual object.

According to an embodiment, in the memory is recorded a multiplicity of Fourier transforms of respectively a multiplicity of distinct virtual objects in the k-space or a multiplicity of representations in the reciprocal k-space of a multiplicity of distinct virtual objects.

According to an embodiment, the Fourier transforms or the representations in the reciprocal k-space of a multiplicity of distinct virtual objects have amplitudes distinct from each other and/or shapes distinct from each other and/or positions distinct from each other.

According to an embodiment, the MRI virtual object is a visual representation of the MRI reference signal in an MRI image.

According to an embodiment, the generating means comprises a multiplication element for multiplying of the virtual object prescribed signal or of a signal obtained from at least the virtual object prescribed signal by the time signal of external stimulation.

According to an embodiment, the generating means comprises an element of frequential transposition of the virtual object prescribed signal or of a signal obtained from at least the virtual object prescribed signal to one or more MRI and/or MRS determined frequencies.

According to an embodiment, the determined frequency is the MRI and/or MRS Larmor frequency.

According to an embodiment, the generating means comprises an element for triggering of the virtual object prescribed signal or of a signal obtained from at least the virtual object prescribed signal a plurality of successive times according to sequencing determined as a function of the MRI and/or MRS synchronization signal.

According to an embodiment, the determined sequencing is sequencing of EPI type (EPI meaning Echo Planar Imaging) for the MRI synchronization signal, the MRI virtual object and the MRI reference signal.

According to an embodiment, the determined sequencing is a delay of the virtual object prescribed signal based on echo time extracted from the MRI synchronization signal, for the MRI virtual object and for the MRI reference signal.

According to an embodiment, the output is connected to an antenna for emitting of the MRI and/or MRS reference signal.

According to an embodiment, the stimulation signal is a stimulation control signal of a living being.

According to an embodiment, the stimulation signal comprises at least one sensory stimulation control signal and/or at least one injection control signal of a contrast product.

A second subject matter of the invention is a method for producing an MRI and/or MRS reference signal, by means of the production module as described above, characterized in that
- a time signal of external stimulation is sent by a stimulation control module to a second receiving input, forming part of the production module,
- an MRI and/or MRS synchronization signal is sent, by an MRI and/or MRS measuring assembly to a first receiving input forming part of the production module,
- supply means, forming part of the production module, provides a prescribed signal representing an MRI and/or MRS virtual object,
- generating means, forming part of the production module, uses the MRI and/or MRS synchronization signal, the time signal of external stimulation and the MRI and/or MRS virtual object prescribed signal, to generate the MRI and/or MRS reference signal, such that the MRI and/or MRS reference signal varies temporally in the same way as a time characteristic determined from the time signal of external stimulation and in synchronization with the MRI and/or MRS synchronization signal,
- a supply output, forming part of the production module, provides the MRI and/or MRS reference signal.

A third subject matter of the invention is a computer program, comprising instructions for executing the method for producing an MRI and/or MRS reference signal, as described above, when it is run on a computer.

A fourth subject matter of the invention is a MRI and/or MRS imaging device, comprising:
- an MRI and/or MRS measuring assembly, for emitting MRI and/or MRS excitation signals in an examination volume containing a body to be studied and for detecting MRI and/or MRS response signals emitted by the body in response to these excitation signals,
- characterized in that the device further comprises:
- the module for producing an MRI and/or MRS reference signal as described above, whereof the first receiving input is connected to a supply output for supplying of the MRI and/or MRS synchronization signal of the measuring assembly, and whereof the second receiving input is connected to a stimulation control module providing the time signal of external stimulation,
- at least one emitting antenna, which is distinct from the measuring assembly and which is connected to the production module for transmitting the MRI and/or MRS reference signal, such that the MRI and/or MRS reference signal having been emitted by the emitting antenna can be detected by the measuring assembly,
- a control module, connected to the measuring assembly and configured for generating, by MRI and/or MRS processing of the response signals having been detected by the measuring assembly and of the emitted MRI and/or MRS reference signal, having been detected by the measuring assembly, at least one image comprising:
  - a visual representation corresponding to the body to be studied or to a part of the latter,
  - the MRI and/or MRS virtual object represented by the virtual object prescribed signal, this virtual object being distinct from the visual representation of the body or of the part of the body,
- the stimulation control module being connected to a module for sensory stimulation of the body being a living being for providing the latter with the time signal of external stimulation, the module for sensory stimulation being capable of emitting at least one sensory stimulation, other than the MRI and/or MRS excitation signals, to the body as a function of the time signal of external stimulation.

A fifth subject matter of the invention is an MRI and/or MRS imaging method, wherein
- MRI and/or MRS excitation signals in an examination volume containing a body to be studied are emitted by an MRI and/or MRS measuring assembly,
- characterized in that
- a time signal of external stimulation is sent by a stimulation control module to a second receiving input of the production module as described above and to a sensory stimulation module, which emits at least one sensory stimulation, other than the MRI and/or MRS excitation signals, to the body as a function of the time signal of external stimulation,
- an MRI and/or MRS synchronization signal is sent by the MRI and/or MRS measuring assembly to a first receiving input of the production module,
- an MRI and/or MRS reference signal is produced by the production module as a function of the time signal of external stimulation, as a function of the MRI and/or MRS synchronization signal and as a function of the virtual object prescribed signal present in the production module,
- the MRI and/or MRS reference signal is emitted by at least one emitting antenna, which is distinct from the measuring assembly and which is connected to the production module,
- MRI and/or MRS response signals emitted by the body in response to the excitation signals are detected by the measuring assembly, and the MRI and/or MRS reference signal having been emitted by the emitting antenna is detected by the measuring assembly,
- at least one image is generated by a control module, connected to the measuring assembly, by MRI and/or MRS processing of the response signals having been detected by the measuring assembly and of the emitted MRI and/or MRS reference signal, having been detected by the measuring assembly, the at least one image comprising:
  - a visual representation corresponding to the body to be studied or to a part of the latter,
  - the MRI and/or MRS virtual object represented by the virtual object prescribed signal, this virtual object being distinct from the visual representation of the body or of the part of the body.

A sixth subject matter of the invention is a computer program, comprising instructions for executing the MRI and/or MRS imaging method as described above, when it is run on a computer.

According to an embodiment of the invention, the module for producing reference signals being configured to produce the MRI and/or MRS reference signals corresponding to the stimulation control signal, such that the virtual reference present in the image is slaved on the sensory stimulation.

According to an embodiment of the invention, the module for producing the reference signals comprises at least one filter receiving at input the stimulation control signal to supply at output a filtered version of the stimulation control signal, as a function of which the reference signals are produced.

According to an embodiment of the invention, the measuring assembly comprises a supply output of an MRI and/or MRS synchronization signal, to which the production module is connected, which is configured such that the reference signals are synchronized with the MRI and/or MRS synchronization signal.

According to an embodiment of the invention, the production module, the stimulation control module and the measuring assembly are configured so that in the image the virtual reference varies with the same time clock as that of the sensory stimulation emitted by the sensory stimulation module.

According to an embodiment of the invention, the production module, the stimulation control module and the measuring assembly are configured so that in the image the visual representation corresponding to the body and the virtual visual reference are synchronized to the sensory stimulation emitted by the sensory stimulation module.

The invention will be more clearly understood from the following description given solely by way of non-limiting example in reference to the appended drawings, in which.

An MRI and/or MRS imaging device 1 is first described below in general, wherein the production module 6 of an MRI and/or MRS reference signal S0 according to the invention can be used.

The reference signal S0 is a controlled signal, for example radiofrequency, having the features of an MRI and/or MRS signal. The reference signal S0 is capable of being read by an MRI and/or MRS imaging device 1, specifically by the detection elements 22 of the latter.

Figure 1:
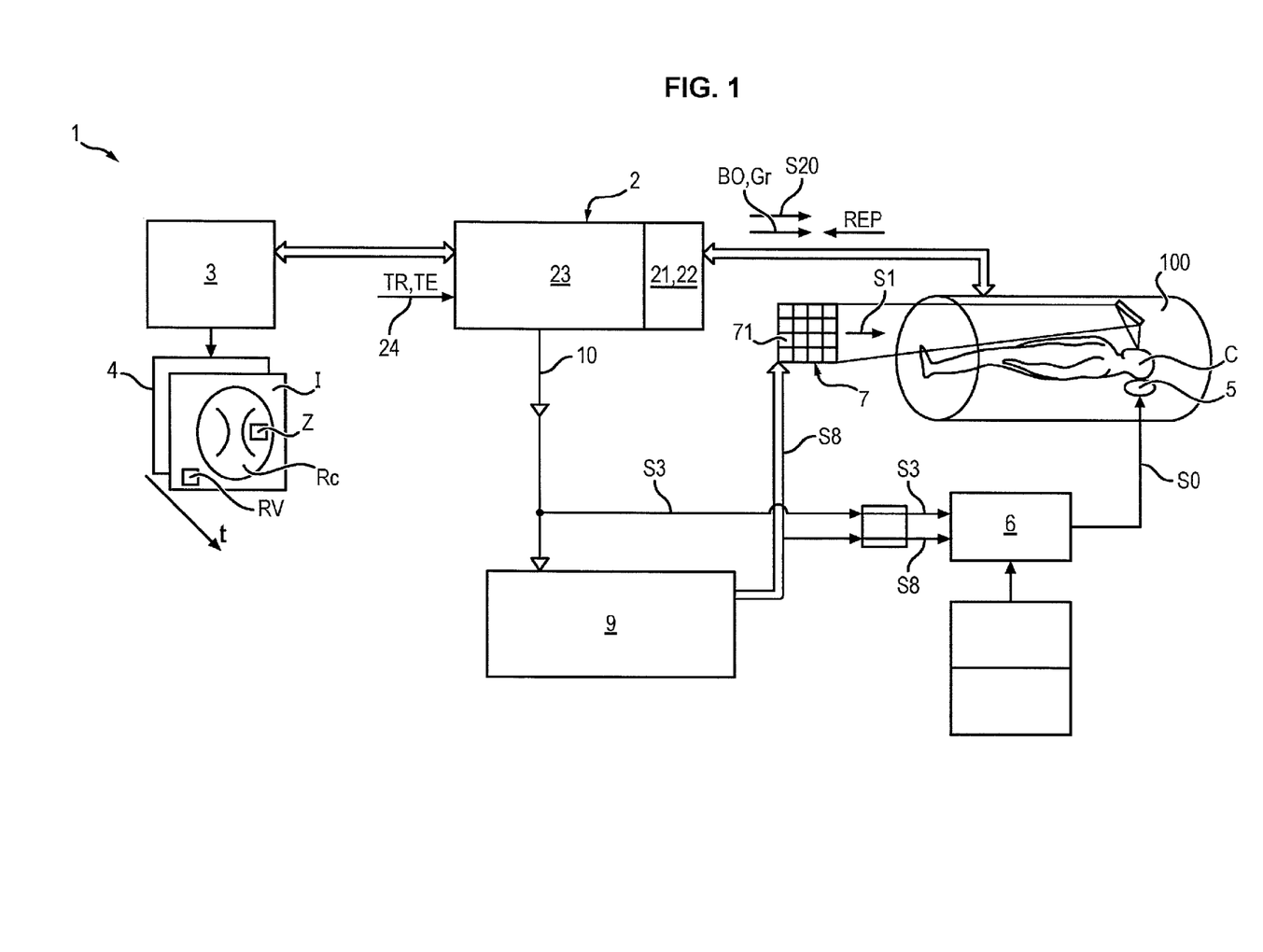
FIG. 1 is a schematic view of an MRI and/or MRS imaging device, wherein a module for producing an MRI and/or MRS reference signal can be used, according to an embodiment of the invention.

In FIG. 1, the MRI and/or MRS imaging device 1, which can be provided to form at least one image or a spectrum of an object C or body C to be studied (designated overall below by body C), comprises a measuring assembly 2, for emitting MRI and/or MRS excitation signals in an examination volume containing the body C. This measuring assembly 2 also serves for detecting MRI and/or MRS response signals REP emitted by the body in response to the MRI and/or MRS excitation signals.

It is known by the skilled person that the MRI and/or MRS excitation signals comprise an intense bias magnetic field B0 of a few tenths of tesla to a few teslas, for example from 0.1 to 5 T, magnetic field gradients Gr and an electromagnetic excitation radiofrequency signal S20, which can comprise radiofrequency electromagnetic pulses S20, to excite molecules in the body C located in the examination volume 100. The excitation signals B0, S20, Gr are emitted by means of emitting elements 21, which can comprise one or more magnets and/or one or more coils for the emission of the magnetic field B, and one or more antennas for transmission of the radiofrequency excitation signal S20.

The measuring assembly 2 further comprises detection elements 22 for detection of the MRI and/or MRS response signals. These detection elements 22 can comprise the same antenna(s) as the emitting antenna(s) of the emitting elements 21, which are both emitting and receiving, or one or more other receiving antennas.

According to an embodiment, the measuring assembly 2 comprises a supply output 10 to supply an MRI and/or MRS synchronization signal S3.

Described below are:
first the production module 6 in the general case of the MRI and/or MRS,
the method for producing the MRI and/or MRS reference signal S0 (and corresponding program),
the MRI and/or MRS imaging device 1 using the production module 6,
the MRI and/or MRS imaging method using the production module 6 (and corresponding program).

MRI and/or MRS Production Module

Figure 2:
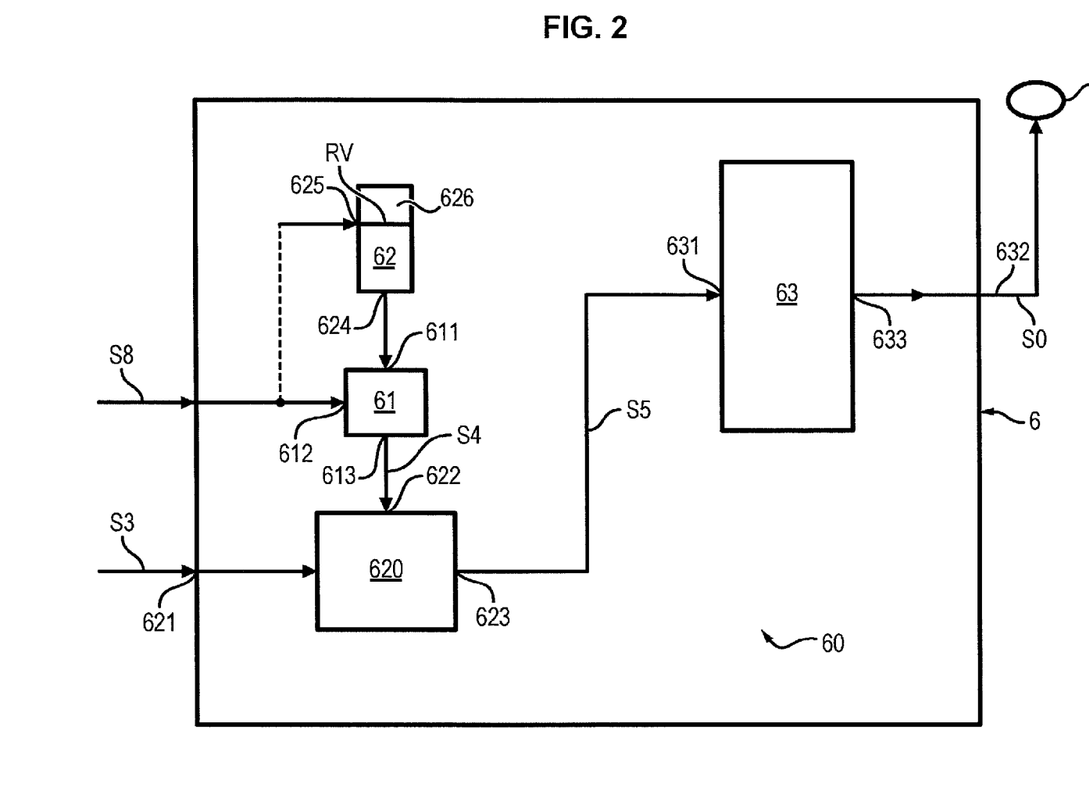
FIG. 2 is a schematic view of a production module 6 of a reference signal, according to an embodiment of the invention.

According to the invention, in FIG. 2 the production module 6 for producing of an MRI and/or MRS reference signal S0, comprises:
a first receiving input 621 for receiving of an MRI and/or MRS synchronization signal S3,
a second receiving input 612 for receiving of a time signal S8 of external stimulation,
supply means 62 for supplying of a prescribed signal RV representing an MRI and/or MRS virtual object RVV,
generating means 60 for generating of the MRI and/or MRS reference signal S0 by use of the MRI and/or MRS synchronization signal S3 with the time signal S8 of external stimulation and with the MRI and/or MRS virtual object prescribed signal RV for temporally varying the MRI and/or MRS reference signal S0 in the same way as a time characteristic determined from the time signal S8 of external stimulation and in synchronization with the MRI and/or MRS synchronization signal S3,
a first supplying output 632 for supplying of the MRI and/or MRS reference signal S0.

This determined time characteristic can be for example the frequency of variation of the time signal S8 of external stimulation and/or a start instant of the time signal S8 of external stimulation. According to an embodiment, the supply means 62 for supplying of a prescribed signal RV representing an MRI and/or MRS virtual object RVV comprises a memory 626, in which is recorded as prescribed signal RV representing an MRI and/or MRS virtual object RVV a Fourier transform of the virtual object RVV, this Fourier transform being in the k-space, or a representation in the reciprocal k-space of the virtual object. The supply means 62 comprises a fourth output 624 by which it sends the MRI and/or MRS virtual object RVV of the memory 626.

Of course, each Fourier transform can be replaced by a representation in the reciprocal k-space of the virtual object. A multiplicity of Fourier transforms of respectively a multiplicity of virtual objects RVV distinct in amplitude and/or shape and/or position in the k-space can be recorded in the memory 626.

According to an embodiment, the supply means 62 for supplying of a prescribed signal RV representing an MRI and/or MRS virtual object RVV comprises a sixth receiving input 625 for receiving of the time signal S8 of external stimulation, to send to the fourth output 624 successively the plurality of Fourier transforms in synchronization with the time signal S8 of external stimulation present on the sixth input 625. The sixth input 625 is for example connected to the first input 612, as is represented by the dashed lines in FIG. 2. According to an embodiment, the generating means 60 comprises a multiplication element 61 for multiplying of the virtual object prescribed signal RV (or of a signal obtained from at least the prescribed signal RV) by the time signal S8 of external stimulation.

According to an embodiment, the generating means comprises an element 63 of frequential transposition of the virtual object prescribed signal RV (or of a signal obtained from at least the prescribed signal RV) to a determined MRI and/or MRS frequency.

According to an embodiment, the determined frequency is the MRI and/or MRS Lamor frequency. In an embodiment, this determined frequency is between 1 MHz and 1 GHz, especially between 10 MHz and 100 MHz and can be for example 64 MHz.

According to an embodiment, the generating means 60 comprises an element 620 for triggering of the virtual object prescribed signal RV (or of a signal obtained from at least the prescribed signal RV) a plurality of successive times according to sequencing determined as a function of the MRI and/or MRS synchronization signal S3.

According to an embodiment, the output 632 is connected to a emitting antenna 5 for emitting of the MRI and/or MRS reference signal S0.

According to an embodiment, the first receiving input 621 is connected to the supply output 10 of the MRI and/or MRS synchronization signal S3.

According to an embodiment, the second receiving input 612 is connected to a stimulation control module 9 providing the time signal S8 of external stimulation.

According to an embodiment, the multiplication element 61 comprises, in addition to the second receiving input 612 for receiving of the time signal S8 of external stimulation, a third receiving input 611 for receiving of the virtual object prescribed signal RV (or of a signal obtained from at least the prescribed signal RV) and a second supplying output 613 for supplying of the product of the signal S8 present on the second input 612 by the signal present on the third input 611.

According to an embodiment, the triggering element 620 comprises, in addition to the first receiving input 621 for receiving of a MRI and/or MRS synchronization signal S3, a fourth receiving input 622 for receiving of the virtual object prescribed signal RV (or of a signal obtained from at least the prescribed signal RV) and a third supplying output 623 for supplying of the signal present on the fourth input 622, sequenced the plurality of successive times according to the sequencing determined as a function of the signal S3 present on the first input 621. The first input 621 is connected to the output 10 to receive this MRI and/or MRS synchronization signal S3.

According to an embodiment, the element 63 of frequential transposition to an MRI and/or MRS determined frequency comprises a fifth receiving input 631 for receiving of the virtual object prescribed signal RV (or of a signal obtained from at least the prescribed signal RV) to supply on its fifth output 633 the frequential transposition of the signal present on its input 631.

According to an embodiment, shown in FIG. 2, the third input 611 is connected to the output 624 of the supply means 62 for supplying of the prescribed signal RV representing the MRI and/or MRS virtual object, the fourth input 622 is connected to the second output 613, the third output 623 is connected to the fifth input 631, and the fifth output 633 forms the first supplying output 632 for supplying of the MRI and/or MRS reference signal S0.

Case of the MRI

A first case of an MRI reference signal S0, of an MRI synchronization signal S3 and of a prescribed signal RV representing an MRI virtual object RVV is described below.

This first case is represented by way of example in FIGS. 3, 10, 11 and 12.

In an embodiment, the determined sequencing is sequencing of EPI type for the MRI synchronization signal S3, the MRI virtual object and the MRI reference signal S0.

According to an embodiment, the MRI virtual object RVV is an MRI visual representation in an MRI image.

According to an embodiment, the determined sequencing is a delay of the virtual object prescribed signal RV by echo time TE−Δ extracted from the MRI synchronization signal S3, for the MRI virtual object RVV and for the MRI reference signal S0. This embodiment is represented in FIG. 2.

Case of the MRS

A second case of an MRS reference signal S0, of an MRS synchronization signal S3 and of a prescribed signal RV representing an MRS virtual object RVV is described below.

Figure 14:
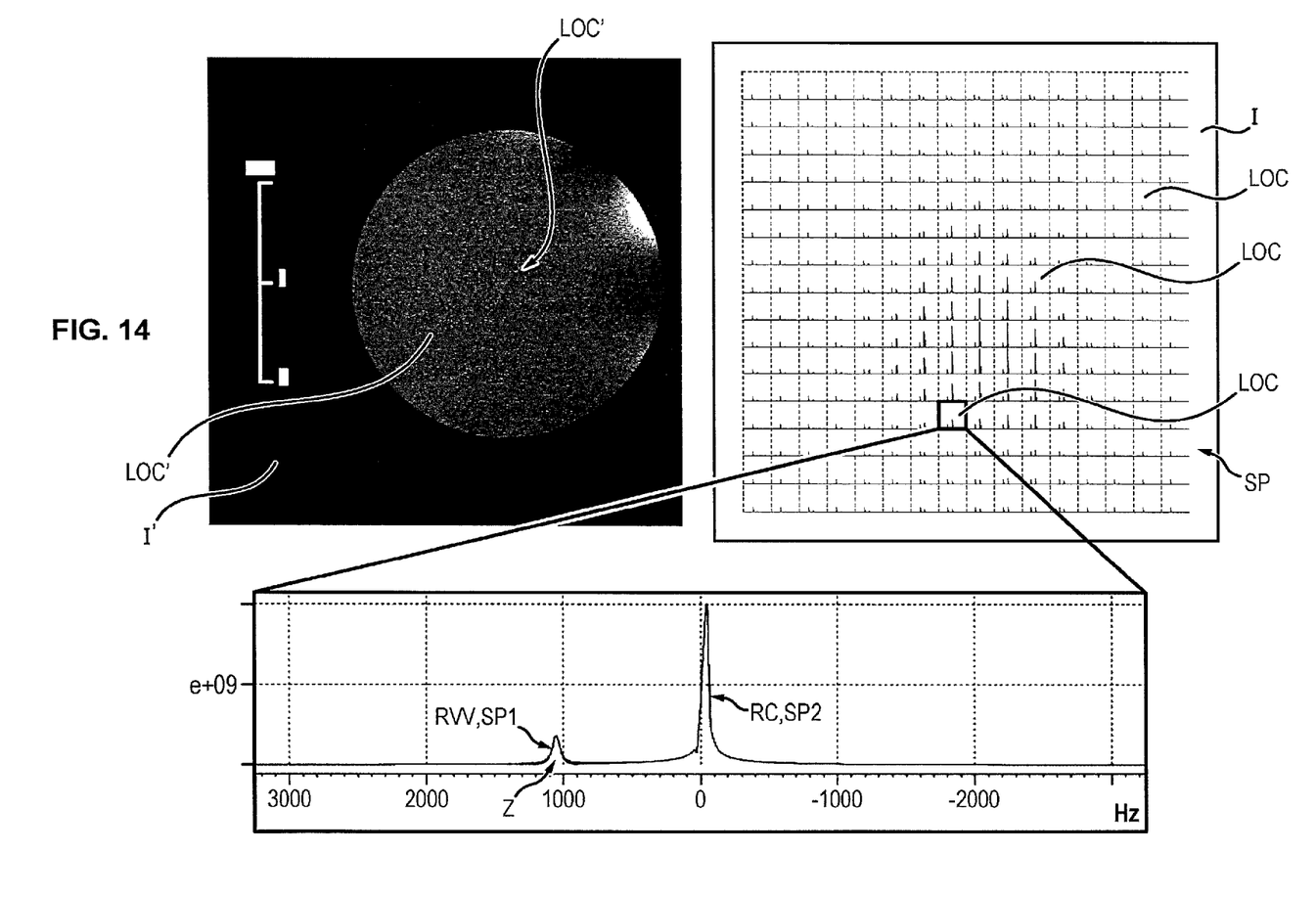
FIG. 14 shows an example of an MRS spectrum obtained by the MRS production module according to an embodiment of the invention.

This second case is represented by way of example in FIG. 14.

In an embodiment, the MRS virtual object RVV is a first MRS virtual spectrum SP1. So, in this case the prescribed signal RV representing the MRS virtual object RVV is a time signal which is the inverse Fourier transform of the first MRS virtual spectrum SP1.

Operating the MRI and/or MRS Production Module 6

The operation of the production module 6 is first explained below in reference to the embodiment of FIG. 2 and FIGS. 3 to 12, in the first case of the MRI.

Figure 7:
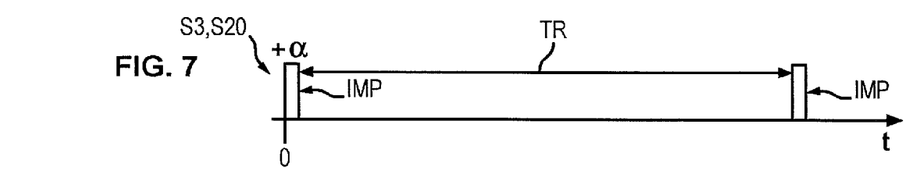
Figure 8:
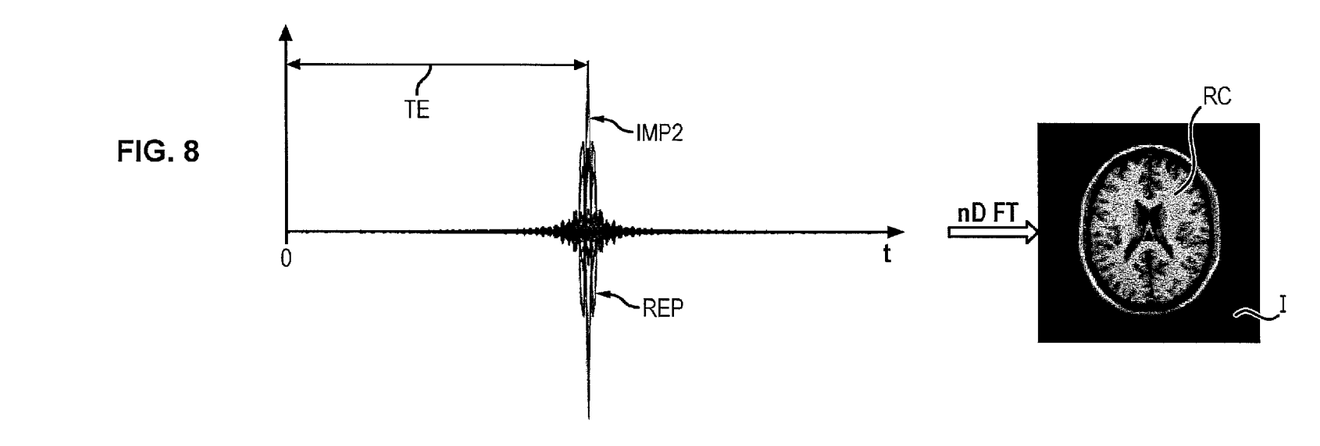

FIG. 7 shows an example of an electromagnetic radiofrequency excitation signal S20, emitted by the measuring assembly 2 to the living being C in the examination volume 100 or near the latter, as a function of the time t in abscissa, in the case of the MRI. This excitation radiofrequency signal S20 for example has a period TR. In FIG. 7, the signal S20 has a pulsed form with the period TR between two successive pulses IMP. On completion of an echo time TE, this excitation signal S20 causes the appearance of the response signal REP emitted by the living being C, as is illustrated in FIG. 8, the time TE being the time elapsed between the response signal REP and the start of each pulse IMP, marked by the instant 0 in FIGS. 7 to 12. This response signal REP is radiofrequency.

Figure 9:
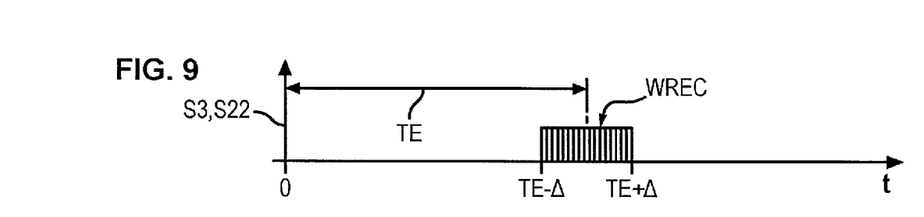

The detection elements 22 of the measuring assembly 2 have a receiving window WREC for receiving of the MRI and/or MRS response signals REP, during which they are active, which is offset by the echo time TE relative to the signal S20, i.e., relative to the start of each pulse IMP, as is illustrated in FIG. 9 representing the acquisition signals S22 of the detection elements 22, having this window WREC. This receiving window WREC is for example centered around the time TE, i.e., the window WREC starts at the time TE−Δ and finishes at the time TE+Δ, where Δ is a determined positive, nonzero duration less than TE, to be able to receive the response signal REP in the pulsed form IMP2 centered on the time TE, so that this pulse IMP2 of the response signals REP is mostly included in the window WREC to be able to be received by the measuring assembly 2 in FIG. 8. The processing means 23 (or nD FT) present in the measuring assembly 2 are configured to produce, from the response signals REP the representation RC of the living being C. This representation RC can be visual or spectral.

Figures 10, 11:
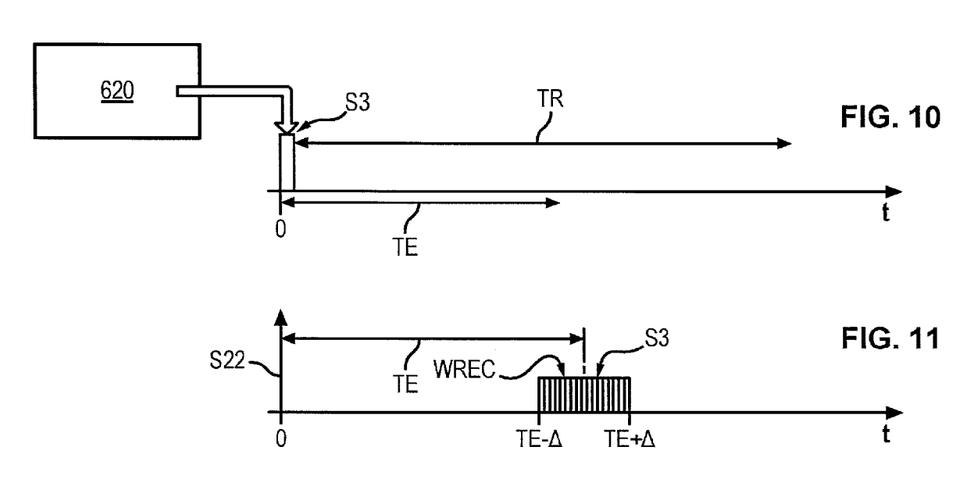
Figure 12:
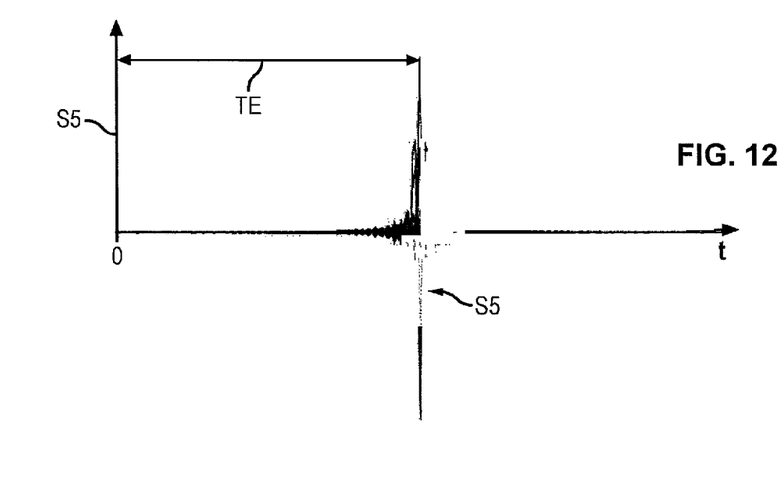

According to an embodiment, the synchronization signal S3 comprises information on the echo time TE and information on the repetition time TR of the radiofrequency excitation signal S20 and/or information on the positioning of the receiving window WREC, as is shown by way of example in FIG. 10. The synchronization signal S3 can be formed for example by the signals S20 and S22 or by a combination of them. The synchronization signal S3 is capable of triggering reception of the signals REP and S0 during the receiving window WREC by the measuring assembly 2 after the echo time TE stalled on the repetition period TR. The times TR and TE are prescribed. The measuring assembly 2 can comprise a prescription input 24 for entering and prescribing the times TR and TE, the processing means 23 and the elements 21 and 22 being triggered as a function of these times TR and TE.

The triggering element 620 provides on its output 623 a signal S5 which is offset temporally by the echo time TE relative to the signal S4 of its input 622. In this way, as is evident in FIG. 12, the signal S5 comprises a version of the signal RV, which is delayed by the echo time TE in the same way as the response signals REP of the living being C. Therefore, the stimulation signal S8 can be acquired by the measuring assembly 2 in the same receiving window WREC as the response signals REP of the living being C.

The module 63 provides on its output 632 the reference signal S0, which is then sent to the emitting antenna 5.

The emitting antenna 5 is located in the examination volume 100 or next to the open examination volume 100. This emitting antenna 5 is distinct from the measuring assembly 2 and is therefore distinct from the emitting elements 21. The emitting antenna 5 serves to emit the MRI and/or MRS reference signals S0 in the examination volume 100. So, the transmitting antenna 5 is distinct especially from the transmitting antenna(s) or from the transceiving antenna(s) included in the elements 21, 22 of the measuring assembly 2. The transmitting antenna 5 can be formed for example by a radiofrequency coil.

The examination volume 100 usually comprises for example what is called an MRI tunnel. Of course, the examination volume can also be included in an open structure.

The reference signals S0, which are emitted by the emitting antenna 5, are configured to be detected by the measuring assembly 2, namely its detection element(s) 22.

Figure 3:
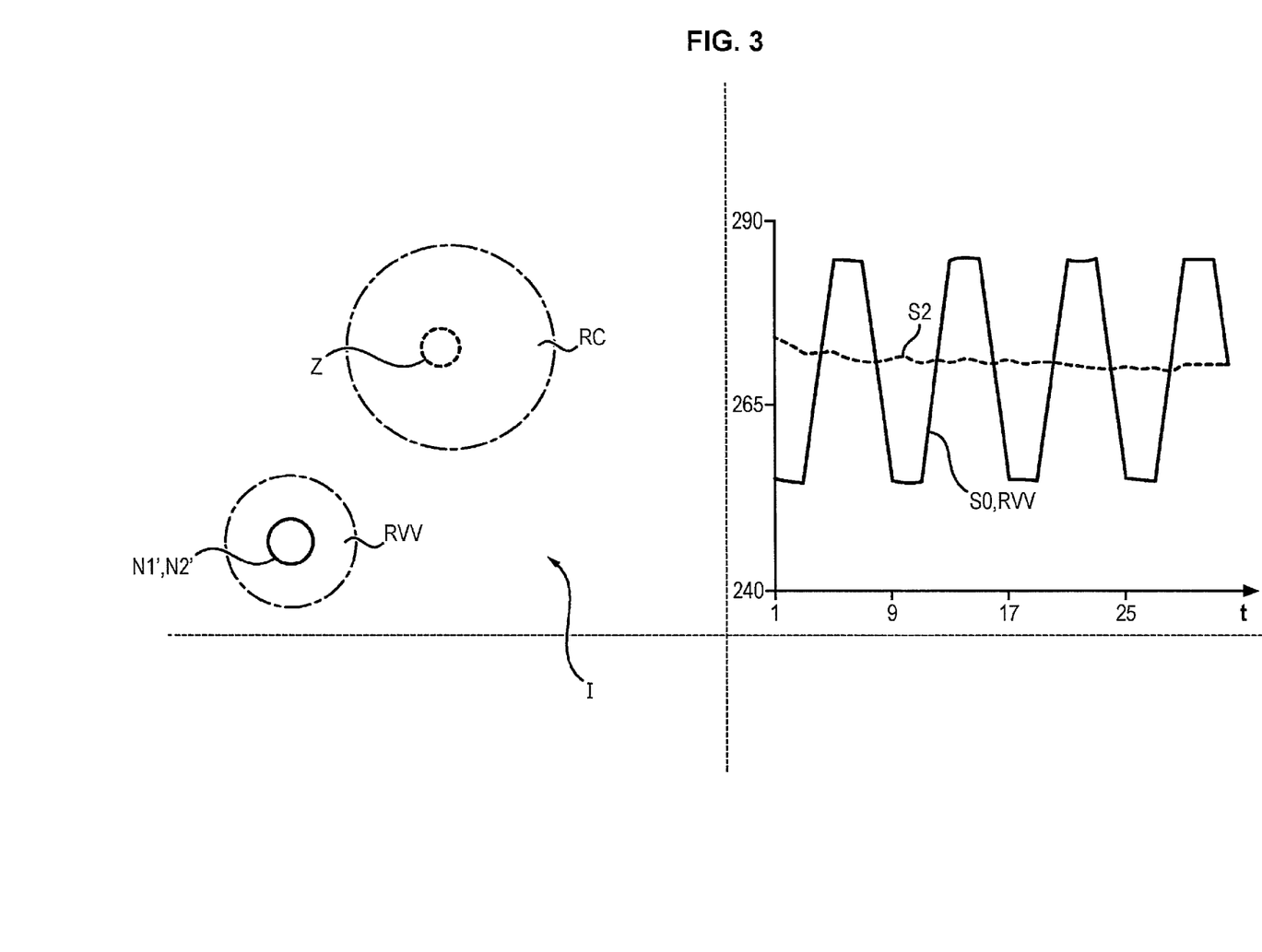
FIG. 3 shows an example of MRI images obtained by the production module according to an embodiment of the invention.

The measuring assembly 2 is connected to a control module 3 configured to generate, from the response signals REP having been detected by the measuring assembly 2 and from the reference signals S0 emitted by the element 5, which have been also detected by this measuring assembly 2, at least one image I shown in FIGS. 1, 3 and 8 (or at least one spectrum SP shown in FIG. 14), comprising a representation RC corresponding to the body C to be studied or to a part of the latter, as well as the virtual object RVV corresponding to the MRI (and/or MRS) reference signal S0. The MRI (and/or MRS) reference signal S0, emitted by the emitting antenna 5 and produced by the module 6, is in fact representative of this virtual object RVV. The virtual object RVV is distinct from the representation RC of the body C or of the part of the body C in the image I (and/or in the spectrum SP). According to an embodiment, the virtual object RVV can be visual in the case of the MRI (or spectral in the case of MRS).

The device 1 optionally comprises at least one display screen 4 for displaying of the image(s) I and/or of the spectrum SP.

The body C can be for example a living being, for example a human being. Therefore, the device 1 is an MRI and/or MRS imaging device for forming at least one image I or a spectrum SP of a living being C, for example a human being. The body C could also be a live animal C. The body C could also be other than a living being.

According to an embodiment, the time signal S8 of external stimulation is a signal S8 of stimulation control of a living being C.

According to an embodiment, the time signal S8 of external stimulation comprises at least one signal S8 for sensory stimulation control and/or at least one signal S8 for injection control of a contrast product.

According to the invention, the device 1 further comprises an external module 7 for modulation of an effect on the body C, this effect being capable of being detected by the measuring assembly 2. For example, the device 1 comprises as modulation module 7 a module 7 for stimulation of the body C located in the examination volume 100 or near the examination volume.

In the case of sensory stimulation, the stimulation module 7 comprises a sensory stimulation module 71, which is capable of emitting at least one sensory stimulation S1 in the examination volume 100 to the body C as a function of at least the stimulation signal S8 supplied to the stimulation module 7 by a stimulation control module 9. This sensory stimulation module 7 is distinct from the emitting elements 21, the sensory stimulation being different to the excitation signals B0, Gr, S20. According to an embodiment, the sensory stimulation S1 is of the one or more following types: visual, sound, olfactory, haptic, muscular, nervous, locomotion.

In the case of a signal S8 for injection control of a contrast product, the stimulation module 7 comprises an module, not shown, for injection of a contrast product in the body C or in the object C.

According to an embodiment of the invention, the production module 6 for production of the reference signal S0 is configured to produce the MRI and/or MRS reference signal S0 which corresponds to the stimulation signal S8, such that the modulation frequency of the intensity (or of the characteristic shape) of the virtual object RVV present in the image I (or in the spectrum SP) is slaved on the sensory stimulation frequency S1. Therefore, the periodic evolution of the intensity or of the shape of the virtual object RVV is slaved as a function of the sensory stimulation S1. Therefore, according to the invention, a virtual object RVV is created whereof the shape and intensity can vary over time, in synchronization with an external signal S8.

Therefore, the invention inserts in the image I or in the spectrum SP a virtual object RVV whereof the characteristics in intensity or shape or position enable to get the temporal evolution of the sensory stimulation S1. This therefore lets a user well distinguish the virtual object RVV relative to the representation RC on a screen.

The invention provides a direct correlation between the stimulation S1 sent to the body C and the effect produced by this stimulation S1 in the representation RC of the body C.

This representation RC can be for example a sectional view of the brain of a human being C, as shown in FIGS. 1 and 8, or more generally a sectional view of the brain of a living being C in the case of MRI. In the case of MRS in FIG. 14, the visual representation RC of the body C or part of the body C is a second spectrum SP2 (spectral representation RC). The measuring assembly 2 and/or the control module 3 are configured to supply a plurality of second spectra SP2 calculated for respectively a plurality of parts LOC' of an MRI image I', these parts LOC' being for example juxtaposed squares or rectangles into which the image I' is divided. Therefore, each second spectrum SP2 of a part LOC of the MRS image I is the Fourier transform of the corresponding part LOC' of the MRI image I'. The MRS spectrum SP comprises a plurality of parts LOC corresponding in their location to the plurality of parts LOC' of the MRI image I', these parts LOC being for example juxtaposed squares or rectangles into which the MRS image I is divided. The first virtual spectrum SP1 is superposed onto the second spectrum SP2 in each part LOC of the spectrum SP. The MRS spectrum SP comprises the MRS virtual object RVV (first spectrum SP1) and the visual representation RC (second spectrum SP2) of the body C or part of the body C.

For example, the MRS virtual object RVV (or spectrum SP1) is or comprises a characteristic peak distinct from the representation RC, so that a user may distinguish well the virtual object RVV relative to the representation RC on a screen 4.

The invention enables to solve the problem of the functional MRI or of the MRS, in which it is not known to relate the small variations in intensity located in the visual or spectral representation RC precisely to a cause in real time. By way of the invention, the reference signal S0 detected by the measuring assembly 2 directly reproduces the sensory stimulation S1 which is the cause of the small variations in light intensity located in the image I or in the viewed spectrum SP, for example in a zone Z.

The practitioner who observes the images I or the spectra SP succeeding each other in time can thus make the relationship between the sensory stimulation S1 and the effect which this sensory stimulation S1 produces in the visual or spectral representation RC of the living being C in the image I or in the spectrum SP.

One of the advantages of the invention is that, relative to the functional MRI or known MRS devices, each image I or spectrum SP comprises a virtual object RVV stalled on the sensory stimulation S1.

FIG. 3 shows an image I comprising, in addition to the visual representation RC of the body C containing the zone Z, the virtual object RVV stalled temporally on the sensory stimulation S1, distinct from the visual representation RC.

Figure 4:
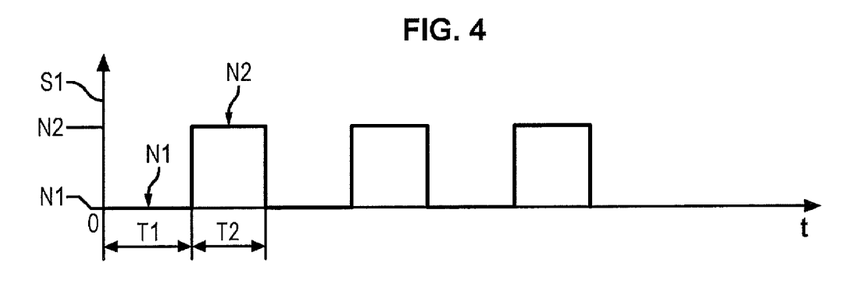
FIGS. 4 to 12 show chronograms of signals appearing in the MRI and/or MRS imaging device according to an embodiment of the invention.
Figure 5:
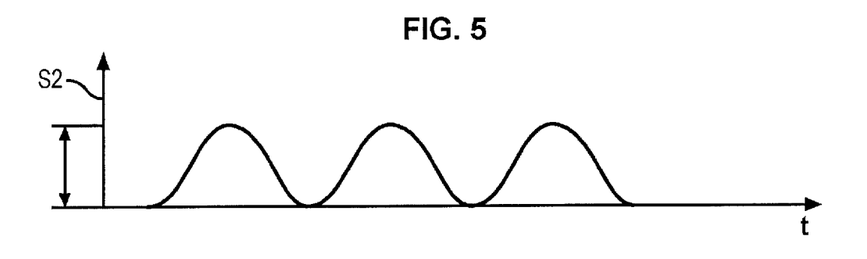

It is supposed, for example, that the sensory stimulation Si is a visual stimulation, comprising two different successive light levels N1 and N2, namely a first level N1 over a duration T1, followed by a second level N2 over a duration T2, as shown in FIG. 4, showing the signal S1 in ordinates as a function of the time tin abscissa. The signal S1 of FIG. 4 is for example periodic, each duration T1, T2 which can be a few seconds, for example more than 0.1 second, for example between a second and a minute, and for example 30 seconds. The effect of this stimulation S1 on the visual representation RC of the living being is a signal S2 which is a variation in light intensity of one or more zones Z of the living being C in the image I, which are weak relative to the difference between the pixels in the highest light intensity and those pixels in the lowest light intensity present in the visual representation RC of the living being C, and which can in general be equal from 0.5 to 3% of this difference. This signal S2 is represented in FIG. 3 and enlarged in FIG. 5. Consequently, some of the pixels located in the zone Z of the image I vary according to the signal S2 according to a very low amplitude in variation, without knowledge in advance of where this zone Z is located in the image I, the aim being just to determine which zone Z of the living being C is stimulated by the stimulation S1. There is for example an image I following a determined period, which can be for example every 2 to 4 seconds.

Figure 6:
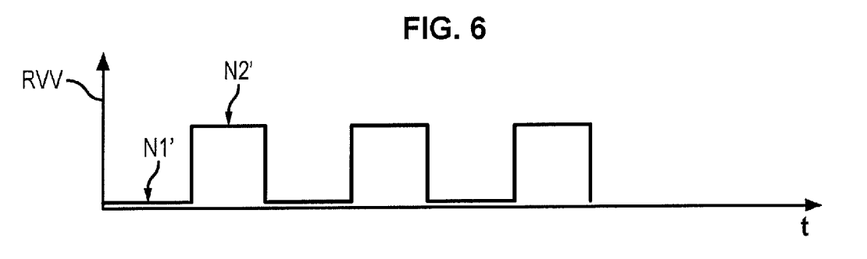

According to an embodiment corresponding to the example of FIG. 4, the virtual object RVV obtained in the image I varies temporally according to the profile of FIG. 6. Therefore, when the sensory stimulation S1 is at the low level N1 over duration T1, the virtual object RVV has, in a corresponding way over this duration T1 in the image I, for example a first level in light intensity N1', whereas when the sensory stimulation S1 has the high second level N2 over the duration T2, the virtual object RVV has over the duration T2 in the image I a second level N2' different to the first level N1'. The virtual object RVV is or comprises for example a region distinct from the visual representation RC of the body, such as for example a circle in the MRI image I.

In FIG. 3, visual comparison of the levels N1', N2' changing over time in the virtual object RVV present in the image I, enables to synchronize the visual representation RC of the living being C with the sensory stimulation S1 which is sent to it, which lets the practitioner to better distinguish and better interpret the variations in light intensity of the zone Z of the living being C or the movements and deformations of this zone Z in the image I. The image I can also contain a chronogram of signals S2 and S0 (or RV), with the same time scale t or the same time axis t.

Therefore, according to an embodiment, the production module 6, the stimulation control module 9 and the measuring assembly 2 are configured so that, in the image I, the virtual object RVV varies with the same time clock as that of the sensory stimulation S1 emitted by the sensory stimulation module 7.

According to an embodiment, the production module 6, the stimulation control module 9 and the measuring assembly 2 are configured so that, in the image I, the visual representation RC corresponding to the living being C and the virtual object RVV are synchronized on the sensory stimulation S1 emitted by the sensory stimulation module 7.

Method for Producing an MRI and/or MRS Reference Signal

Figure 13:
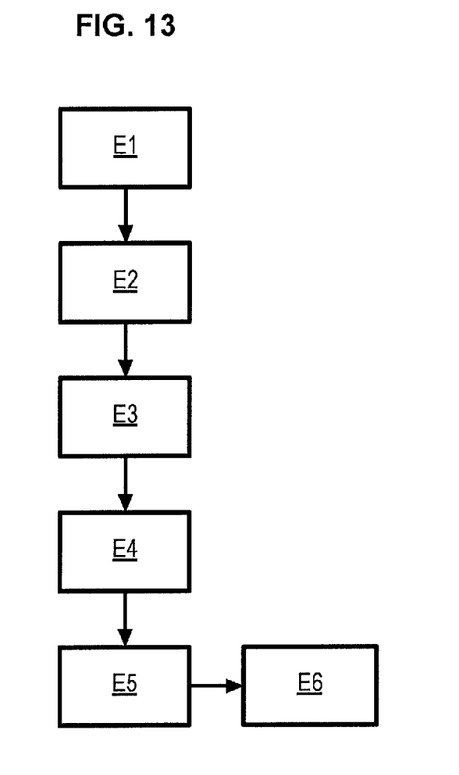
FIG. 13 show a flowchart of a method according to an embodiment of the invention.

The invention also relates to a method for producing the MRI and/or MRS reference signal S0, by means of the production module 6. The steps of this method are shown in FIG. 13.

During a step E2, the time signal S8 of external stimulation is sent by the stimulation control module 9 to the second receiving input 612.

During a step E3, the MRI and/or MRS synchronization signal S3 is sent by the MRI and/or MRS measuring assembly 2 to the first receiving input 621.

During step E3, the supply means 62 provides the prescribed signal RV representing an MRI and/or MRS virtual object RVV.

During a step E4, the generating means, forming part of the production module 6, uses the MRI and/or MRS synchronization signal S3, the time signal S8 of external stimulation and the MRI and/or MRS virtual object prescribed signal RV, to generate the MRI and/or MRS reference signal S0, such that the MRI and/or MRS reference signal S0 varies temporally in the same way as a time characteristic determined from the time signal S8 of external stimulation and in synchronization with the MRI and/or MRS synchronization signal S3.

During step E4, the supply output 632 provides the MRI and/or MRS reference signal S0.

Computer Program for Production of the MRI and/or MRS Reference Signal S0

The invention also relates to a computer program, comprising instructions for executing the method for producing the MRI and/or MRS reference signal S0 when it is run on a computer. This computer program can be recorded in the production module 6.

MRI and/or MRS Imaging Device Using the Production Module

The invention also relates to an MRI and/or MRS imaging device, comprising:

an MRI and/or MRS measuring assembly 2, for emitting excitation MRI and/or MRS signals B0, S20, Gr in the examination volume 100 containing a body C to be studied and for detecting MRI and/or MRS response signals REP emitted by the body C in response to these excitation signals B0, S20, Gr, characterized in that the device further comprises:

the production module 6 for producing of the MRI and/or MRS reference signal S0, whereof the first receiving input 621 is connected to the supply output 10 for supplying of the MRI and/or MRS synchronization signal S3 of the measuring assembly 2, and whereof the second receiving input 612 is connected to the stimulation control module 9 providing the time signal S8 of external stimulation, the emitting antenna 5, which is distinct from the measuring assembly 2 and which is connected to the production module 6 for emitting the MRI and/or MRS reference signal S0, such that the MRI and/or MRS reference signal S0 having been emitted by the emitting antenna 5 can be detected by the measuring assembly 2, the control module 3, connected to the measuring assembly 2 and configured for generating, by MRI and/or MRS processing of the response signals having been detected by the measuring assembly 2 and of the emitted MRI and/or MRS reference signal S0, having been detected by the measuring assembly 2, at least one image comprising:

the visual representation RC corresponding to the body C to be studied or to a part of the latter, the MRI and/or MRS virtual object RVV represented by the virtual object prescribed signal RV, this virtual object RVV being distinct from the visual representation of the body C or of the part of the body, the stimulation control module 9 being connected to the sensory stimulation module 71 of the body C being a living being for providing the latter with the time signal S8 of external stimulation, the sensory stimulation module 71 being capable of emitting at least one sensory stimulation S1, other than the MRI and/or MRS excitation signals B0, S20, Gr, to the body C as a function of the time signal S8 of external stimulation.

MRI and/or MRS Imaging Method

The invention also relates to an MRI and/or MRS imaging method using the production module. The steps of this method are shown in FIG. 13.

During a step E1, the MRI and/or MRS excitation signals B0, S20, Gr are emitted in the examination volume 100 containing the body C to be studied by the MRI and/or MRS measuring assembly 2.

During a step E2, the time signal S8 of external stimulation is sent by the stimulation control module 9 to the second receiving input 612 of the production module 6 and to the sensory stimulation module 71, which emits E2 at least one sensory stimulation S1, other than the MRI and/or MRS excitation signals B0, S20, Gr, to the body C as a function of the time signal S8 of external stimulation.

During a step E3, the MRI and/or MRS synchronization signal S3 is sent by the MRI and/or MRS measuring assembly 2 to the first receiving input 621 of the production module 6.

During a step E4, the MRI and/or MRS reference signal S0 is produced by the module 6 as a function of the time signal S8 of external stimulation, as a function of the MRI and/or MRS synchronization signal S3 and as a function of the virtual object prescribed signal RV present in the production module 6.

During step E4, the MRI and/or MRS reference signal S0 is emitted by the at least one emitting antenna 5, which is distinct from the measuring assembly 2 and which is connected to the production module 6.

During a step E5, the MRI and/or MRS response signals REP emitted by the body C in response to the excitation signals B0, S20, Gr are detected by the measuring assembly 2 and the MRI and/or MRS reference signal S0 having been emitted by the emitting antenna 5 is detected by the measuring assembly 2.

During a step E6, at least one image (I, SP) is generated by the control module 3, connected to the measuring assembly 2, by MRI and/or MRS processing of the response signals REP having been detected by the measuring assembly 2 and of the emitted MRI and/or MRS reference signal S0, having been detected by the measuring assembly 2, the image comprising:

a visual representation RC corresponding to the body C to be studied or to a part of the latter, the MRI and/or MRS virtual object RVV represented by the virtual object prescribed signal RV, this virtual object RVV being distinct from the visual representation RC of the body C or of the part of the body.

MRI and/or MRS Imaging Computer Program

The invention also relates to a computer program, comprising instructions for executing the MRI and/or MRS imaging method, when it is run on a computer. This computer program can be recorded in the MRI and/or MRS imaging device 1.

According to an embodiment, the image I is displayed (step E6) on at least one display screen 4.

According to an embodiment, the production module 6 for producing of the MRI and/or MRS reference signal S0 is configured to produce the MRI and/or MRS reference signal S0 corresponding to the stimulation control signal S8 such that the virtual object RVV present in the image I is slaved on the sensory stimulation S1.

Of course, the order of the elements 61, 620 and 63 in FIG. 2 can be changed round, as indicated by the expression "signal obtained from at least the prescribed signal RV" in the above.

Therefore, according to another embodiment, the fourth input 622 is connected to the output 624 of the supply means 62 for supplying of the prescribed signal RV representing the MRI and/or MRS virtual object RVV, the third input 611 is connected to the third output 623, the second output 613 is connected to the fifth input 631 and the fifth output 633 forms the first supply output 632 for supplying of the MRI and/or MRS reference signal S0.

According to yet another embodiment, the fourth input 622 is connected to the output 624 of the supply means 62 for supplying of the prescribed signal RV representing the MRI and/or MRS virtual object RVV, the third output 623 is connected to the fifth input 631, the output 633 is connected to the third input 611 and the second output 613 is connected to the emitting element 5 and forms the supply output for supplying of the MRI and/or MRS reference signal S0.

Of course, the embodiments described above can be combined.

The invention claimed is:

1. A module -for producing an MRI and/or MRS reference signal, comprising:
    a first receiving input for receiving of an MRI and/or MRS synchronization signal from an MRI and/or MRS measuring assembly,
    a second receiving input for receiving of a time signal of external stimulation from a stimulation control module,
    supply means for supplying of a prescribed signal representing an MRI and/or MRS virtual object,
    generating means, connected to the first receiving input, to the second receiving input and to the supply means, for generating of the MRI and/or MRS reference signal by use of the MRI and/or MRS synchronization signal with the time signal of external stimulation and with the prescribed signal representing the MRI and/or MRS virtual object, for temporally varying the MRI and/or MRS reference signal in the same way as a time characteristic determined from the time signal of external stimulation and in synchronization with the MRI and/or MRS synchronization signal,
    a supply output, connected to the generating means, for supplying of the MRI and/or MRS reference signal,
    wherein the supply means for supplying of the prescribed signal representing the MRI and/or MRS virtual object comprises a memory in which is recorded the prescribed signal representing the MRI and/or MRS virtual object.

2. The module for producing an MRI and/or MRS reference signal according to claim 1, wherein in the memory is recorded as prescribed signal representing an MRI and/or MRS virtual object a Fourier transform, in the k-space, of the virtual object or a representation in the reciprocal k-space of the virtual object.

3. The module for producing an MRI and/or MRS reference signal according to claim 2, wherein in the memory is recorded a multiplicity of Fourier transforms of respectively a multiplicity of distinct virtual objects in the k-space or a multiplicity of representations in the reciprocal k-space of a multiplicity of distinct virtual objects.

4. The module for producing an MRI and/or MRS reference signal according to claim 3, wherein the Fourier transforms or the representations in the reciprocal k-space of a multiplicity of distinct virtual objects have amplitudes distinct from each other and/or shapes distinct from each other and/or positions distinct from each other.

5. The module for producing an MRI and/or MRS reference signal according to claim 1, wherein the generating means comprises a multiplication element for multiplying of the prescribed signal representing the MRI and/or MRS virtual object or of a signal obtained from at least the prescribed signal representing the MRI and/or MRS virtual object by the time signal of external stimulation.

6. The module for producing an MRI and/or MRS reference signal according to claim 1, wherein the generating means comprises an element of frequential transposition of the prescribed signal representing the MRI and/or MRS virtual object or of a signal obtained from at least the prescribed signal representing the MRI and/or MRS virtual object to one or more MRI and/or MRS determined frequencies.

7. The module for producing an MRI and/or MRS reference signal according to claim 1, wherein the determined frequency is an MRI and/or MRS Larmor frequency.

8. The module according to claim 1, comprising an antenna, connected to the supply output, for emitting of the MRI and/or MRS reference signal supplied by the supply output.

9. The module for producing an MRI and/or MRS reference signal according to claim 1, wherein the time signal of external stimulation is a signal of control of stimulation of a living being.

10. The module for producing an MRI and/or MRS reference signal according to claim 1, wherein the time signal of external stimulation comprises at least one signal of control of sensory stimulation and/or at least one signal of control of injection of a contrast product.

11. The module for producing an MRI and/or MRS reference signal according to claim 1, wherein the generating means comprises an element for triggering of the prescribed signal representing the MRI and/or MRS virtual object or of a signal obtained from at least the prescribed signal representing the MRI and/or MRS virtual object a plurality of successive times according to sequencing determined as a function of the MRI and/or MRS synchronization signal.

12. The module for producing an MRI and/or MRS reference signal according to claim 11, wherein the determined sequencing is sequencing of EPI type for the MRI synchronization signal, the MRI virtual object and the MRI reference signal.

13. The module for producing an MRI and/or MRS reference signal according to claim 11, wherein the determined sequencing is a delay of the prescribed signal based on echo time extracted from the MRI synchronization signal, for the MRI virtual object and for the MRI reference signal.

14. The module for producing an MRI and/or MRS reference signal according to claim 1, wherein the MRI virtual object is a visual representation of the MRI reference signal in an MRI image.

15. The module for producing an MRI and/or MRS reference signal according to claim 1, wherein the MRS virtual object is a first MRS virtual spectrum.

16. A method for producing an MRI and/or MRS reference signal, for imaging at least a part of a body, the method performed using an MRI and/or MRS production module having a first receiving input; a second receiving input; supply means; generating means; and a supply output, the method comprising:
    receiving, at the second receiving input, a time signal of external stimulation from a stimulation control module,
    receiving, at the first receiving input, an MRI and/or MRS synchronization signal from the MRI and/or MRS measuring assembly configured to emit MRI and/or MRS excitation signals in an examination volume containing the part of the body,
    providing, at the supply means, a prescribed signal representing an MRI and/or MRS virtual object,
    generating at the generating means, the MRI and/or MRS reference signal based on the MRI and/or MRS synchronization signal, the time signal of external stimulation and the MRI and/or MRS prescribed signal representing the MRI and/or MRS virtual object, such that the MRI and/or MRS reference signal varies temporally (i) in a way that corresponds to a time characteristic determined from the time signal of external stimulation and (ii) in synchronization with the MRI and/or MRS synchronization signal, and outputting, at the supply output, the MRI and/or MRS reference signal.

17. A non-transitory machine-readable storage medium having computer-readable instructions stored thereon, the computer-readable instructions, when executed by a computer, cause the computer to implement a method of producing an MRI and/or MRS reference signal, for imaging at least a part of a body, the method performed using an MRI and/or MRS production module having a first receiving input; a second receiving input; supply means; generating means; and a supply output, the method comprising:

receiving, at the second receiving input, a time signal of external stimulation from a stimulation control module, receiving, at the first receiving input, an MRI and/or MRS synchronization signal from the MRI and/or MRS measuring assembly configured to emit MRI and/or MRS excitation signals in an examination volume containing the part of the body, providing, at the supply means, a prescribed signal representing an MRI and/or MRS virtual object, generating at the generating means, the MRI and/or MRS reference signal based on the MRI and/or MRS synchronization signal, the time signal of external stimulation and the MRI and/or MRS prescribed signal representing the MRI and/or MRS virtual object, such that the MRI and/or MRS reference signal varies temporally (i) in a way that corresponds to a time characteristic determined from the time signal of external stimulation and (ii) in synchronization with the MRI and/or MRS synchronization signal, and outputting, at the supply output, the MRI and/or MRS reference signal.

18. An MRI and/or MRS imaging device, comprising:

an MRI and/or MRS measuring assembly, for emitting MRI and/or MRS excitation signals in an examination volume containing a body to be studied and for detecting MRI and/or MRS response signals emitted by the body in response to these excitation signals, wherein the device further comprises:

the module for producing an MRI and/or MRS reference signal according to claim 1, whereof the first receiving input is connected to a supply output for supplying of the MRI and/or MRS synchronization signal of the measuring assembly, and whereof the second receiving input is connected to a stimulation control module providing the time signal of external stimulation, at least one emitting antenna, which is distinct from the measuring assembly and which is connected to the production module for emitting the MRI and/or MRS reference signal, such that the MRI and/or MRS reference signal having been emitted by the emitting antenna can be detected by the measuring assembly, a control module, connected to the measuring assembly and configured for generating, by MRI and/or MRS processing of the response signals having been detected by the measuring assembly and of the emitted MRI and/or MRS reference signal, having been detected by the measuring assembly, at least one image comprising:

a visual representation corresponding to the body to be studied or to a part of the latter, the MRI and/or MRS virtual object represented by the prescribed signal, this virtual object being distinct from the visual representation of the body or of the part of the body, the stimulation control module being connected to a module for sensory stimulation of the body being a living being for providing the latter with the time signal of external stimulation, the module for sensory stimulation being capable of emitting at least one sensory stimulation, other than the MRI and/or MRS excitation signals, to the body as a function of the time signal of external stimulation.

19. An MRI and/or MRS imaging method for imaging at least a part of a body using: an MRI and/or MRS measuring assembly configured to emit MRI and/or MRS excitation signals in an examination volume containing the part of the body, a stimulation control module configured to transmit a time signal of external stimulation, a sensory stimulation module configured to emit at least one sensory stimulation towards the part of the body, other than the MRI and/or MRS excitation signals, as a function of the time signal of external stimulation, an MRI and/or MRS production module having: a first receiving input; a second receiving input; a supply means; a generating means; and at least one emitting antenna, and a control module connected to the measuring assembly and configured to generate one or more images, the method comprising:

transmitting the time signal of external stimulation from the stimulation control module to each of the second receiving input and the sensory stimulation module, transmitting the MRI and/or MRS synchronization signal from the MRI and/or MRS measuring assembly to the first receiving input, at the supply means of the production module, supplying a prescribed signal representing an MRI and/or MRS virtual object;

generating at the generating means the MRI and/or MRS reference signal as a function of (i) the time signal of external stimulation, (ii) the MRI and/or MRS synchronization signal and (iii) the prescribed signal, wherein the MRI and/or MRS reference signal is temporarily varied in a way that corresponds to a time characteristic determined from the time signal of external stimulation and (iv) in synchronization with the MRI and/or MRS synchronization signal, emitting the MRI and/or MRS reference signal from the at least one emitting antenna, detecting, at the MRI and/or MRS measuring assembly, MRI and/or MRS response signals emitted by the body detecting, at the MRI and/or MRS measuring assembly, the MRI and/or MRS reference signal having been emitted from the at least one emitting antenna, processing the detected MRI and/or MRS response signals and the detected MRI and/or MRS reference signal, and generating, at the control module, at least one image, based on of the processed detected response MRI and/or MRS signals and the process detected MRI and/or MRS reference signal, wherein the at least one image comprises:

a visual representation of at least a part of the body, and the MRI and/or MRS virtual object represented by the prescribed signal, wherein the MRI and/or MRS virtual object is distinct from the visual representation.

20. A non-transitory machine-readable storage medium having computer-readable instructions stored thereon, the computer-readable instructions, when executed by a computer, cause the computer to implement a method of executing the MRI and/or MRS imaging method for imaging at least a part of a body using: an MRI and/or MRS measuring assembly configured to emit MRI and/or MRS excitation signals in an examination volume containing the part of the body,
- a stimulation control module configured to transmit a time signal of external stimulation,
- a sensory stimulation module configured to emit at least one sensory stimulation towards the part of the body, other than the MRI and/or MRS excitation signals, as a function of the time signal of external stimulation,
- an MRI and/or MRS production module having: a first receiving input; a second receiving input; a supply means; a generating means; and a supply output, and at least one emitting antenna, and
- a control module connected to the MRI and/or MRS measuring assembly and configured to generate one or more images, the method comprising:
transmitting the time signal of external stimulation from the stimulation control module to each of the second receiving input and the sensory stimulation module,—
transmitting the MRI and/or MRS synchronization signal from the MRI and/or MRS measuring assembly to the first receiving input,
at the supply means of the production module, supplying a prescribed signal representing an MRI and/or MRS virtual object;
generating at the generating means the MRI and/or MRS reference signal as a function of (i) the time signal of external stimulation, (ii) the MRI and/or MRS synchronization signal and (iii) the prescribed signal, wherein the MRI and/or MRS reference signal is temporally varied in a way that corresponds to a time characteristic determined from the time signal of external stimulation and (iv) in synchronization with the MRI and/or MRS synchronization signal, emitting the MRI and/or MRS reference signal from the at least one emitting antenna, detecting, at the MRI and/or MRS measuring assembly, MRI and/or MRS response signals emitted by the body detecting, at the MRI and/or MRS measuring assembly, the MRI and/or MRS reference signal having been emitted from the at least one emitting antenna, processing the detected MRI and/or MRS response signals and the detected MRI and/or MRS reference signal, and generating, at the control module, at least one image based on the processed detected MRI and/or MRS response signals and the processed detected MRI and/or MRS reference signal, wherein the at least one image comprises:
- a visual representation of the at least a part of the body, and
- the MRI and/or MRS virtual object represented by the prescribed signal, wherein the MRI and/or MRS virtual object is distinct from the visual representation.

* * * * *